US009847763B2

(12) United States Patent
Chang (10) Patent No.: US 9,847,763 B2
(45) Date of Patent: Dec. 19, 2017

(54) SELF-REGULATED REFERENCE FOR SWITCHED CAPACITOR CIRCUIT

(71) Applicant: MediaTek Inc., Hsin-Chu (TW)

(72) Inventor: Wen-Hua Chang, Tainan (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/166,066

(22) Filed: May 26, 2016

(65) Prior Publication Data

US 2017/0077883 A1   Mar. 16, 2017

Related U.S. Application Data

(60) Provisional application No. 62/218,758, filed on Sep. 15, 2015.

(51) Int. Cl.
| | |
|---|---|
| *H03F 1/02* | (2006.01) |
| *H03F 3/45* | (2006.01) |
| *H03H 7/00* | (2006.01) |
| *H03F 1/08* | (2006.01) |
| *H03F 1/30* | (2006.01) |
| *H03F 3/00* | (2006.01) |

(52) U.S. Cl.
CPC ......... *H03F 3/45686* (2013.01); *H03F 1/083* (2013.01); *H03F 1/30* (2013.01); *H03F 3/005* (2013.01); *H03F 3/45* (2013.01); *H03F 3/45273* (2013.01); *H03H 7/004* (2013.01); *H03F 2200/151* (2013.01); *H03F 2200/153* (2013.01); *H03F 2200/159* (2013.01); *H03F 2200/42* (2013.01); *H03F 2200/75* (2013.01); *H03F 2203/45012* (2013.01); *H03F 2203/45061* (2013.01); *H03F 2203/45156* (2013.01); *H03F 2203/45221* (2013.01); *H03F 2203/45244* (2013.01); *H03F 2203/45514* (2013.01); *H03F 2203/45546* (2013.01); *H03F 2203/45551* (2013.01); *H03F 2203/45616* (2013.01)

(58) Field of Classification Search
CPC ............... H03F 1/02; H03F 3/45; H03F 3/387
USPC ..................... 330/9; 327/124, 307
See application file for complete search history.

(56) References Cited

U.S. PATENT DOCUMENTS

| | | | |
|---|---|---|---|
| 5,963,156 A | 10/1999 | Lewicki et al. | |
| 6,703,894 B1 * | 3/2004 | Stockstad | H03H 11/04 327/307 |

OTHER PUBLICATIONS

Extended European Search Report for Application No. EP 16188820.1 dated Feb. 3, 2017.

(Continued)

*Primary Examiner* — Steven J Mottola
(74) *Attorney, Agent, or Firm* — Wolf, Greenfield & Sacks, P.C.

(57) ABSTRACT

A switched-capacitor circuit comprising a differential operational amplifier and a feedback circuit is described. In some embodiments, the feedback circuit may be configured to provide a reference voltage that is insensitive to temperature and/or process variations. In some embodiments, the feedback circuit may be configured to mitigate the time delay associated with one or more capacitors of the switched-capacitor circuit. The switched-capacitor circuit may be controlled by a pair of control signals. During a first phase, one or more capacitors may be charged, or discharged, through an input signal. During a second phase, the electric charge of the one or more capacitors may be retained.

20 Claims, 7 Drawing Sheets

(56) References Cited

OTHER PUBLICATIONS

Boo et al., A 12b 250 MS/s Pipelined ADC with Virtual Ground Reference Buffers. IEEE Journal of Solid-State Circuits. Dec. 2015;50(12):2912-21.
Boo et al., A 12b 250 MS/s Pipelined ADC with Virtual Ground Reference Buffers. ISSCC International Solid-State Circuits Conference. Digest of Technical Papers. 2015:3pgs.

* cited by examiner

SELF-REGULATED REFERENCE FOR SWITCHED CAPACITOR CIRCUIT

RELATED APPLICATIONS

This Application claims priority under 35 U.S.C. §119(e) to U.S. Provisional Application Ser. No. 62/218,758, entitled "SELF-REGULATED REFERENCE FOR SWITCHED CAPACITOR CIRCUIT" filed on Sep. 15, 2015, which is herein incorporated by reference in its entirety.

BACKGROUND

Switched capacitors are electronic circuit elements and are often used in continuous and discrete time signal processing. Switched capacitors operate by moving charges in and out of one or more capacitors when switches are opened or closed. Control signals are often used to drive the state of the switches. Switched capacitors are often used in analog-to-digital (ADC) converters and filters.

BRIEF SUMMARY

According to one aspect of the present application, a switched capacitor circuit is provided. The switched capacitor circuit may comprise a differential operational amplifier; at least one capacitor coupled to an input of the differential operational amplifier; and a feedback circuit coupled to the input of the differential operational amplifier and an input of the switched-capacitor circuit, the feedback circuit being configured to receive a reference signal and to produce, based at least in part on the reference signal, at least one stabilized reference signal.

According to another aspect of the present application, a switched capacitor circuit is provided. The switched capacitor circuit may comprise a differential operational amplifier; at least one capacitor coupled to an input of the differential operational amplifier; and a feedback circuit coupled to the input of the differential operational amplifier and an input of the switched-capacitor circuit, wherein the feedback circuit exhibits a gain configured to cancel, at least in part, a capacitance of the at least one capacitor.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

The inventors have appreciated that the performance of electronic circuits comprising switched capacitor circuits can be greatly improved by stabilizing the reference voltage provided to the switched capacitor. Often, electronic circuits operate in a manner that deviates from the desired operation. For example, a portion of the electronic circuit may exhibit an increase in temperature, either due to electric currents flowing in such portion of the electronic circuit or due to neighboring circuits heating up. Such temperature increase may cause various circuit parameters, such as the threshold voltage of a metal-oxide-semiconductor field effect transistor (MOSFET), to vary unexpectedly. As another example, when fabricated on a semiconductor substrate, an electronic circuit or component may have design parameters, such as the width or the length of a particular doped region or a doping level, that are different from the desired value. Such inaccuracies, referred to herein as "process variations", may also cause various circuit parameters, such as the threshold voltage of a MOSFET, to vary unexpectedly. In some circumstances, such unexpected parameter variations may lead to undesired signals fluctuations, or to signals having values that deviate from the expected values.

Reference voltages are often used in electronic circuits, such as switched capacitor circuits, to ensure reliable operation. For example, a particular class of analog-to-digital converters (ADCs) comprises a switched capacitor circuit, and often utilizes a reference voltage to perform the conversion. However, such a reference voltage may deviate from the desired value for the reasons described above. Consequently, the performance of electronic circuits that rely on stable and predictable reference voltages may be degraded.

One aspect of the present application provides a feedback circuit configured to stabilize a reference voltage in an electronic circuit, such as a switched capacitor circuit. In some embodiments, the reference voltage may be stabilized against temperature and/or process variations.

The inventors have further appreciated that the bandwidth (i.e., speed) of switched capacitor circuits may be increased significantly by providing a feedback circuit having a gain configured to at least partially cancel a capacitance of the switched capacitor circuit. Because the time that it takes to charge or discharge the capacitor is finite and depends on the capacitance associated with the capacitor, a capacitor may introduce signal delays in an electronic circuit. Thus, canceling at least a portion of the capacitance can reduce the signal delays, which increases the speed of the switched capacitor circuit. In some embodiments, a feedback circuit is configured to at least partially cancel a capacitance of the switched capacitor circuit, which increases the speed of the switched capacitor circuit. Such a feedback circuit may have a gain selected to achieve the capacitance cancellation.

Figure 1:
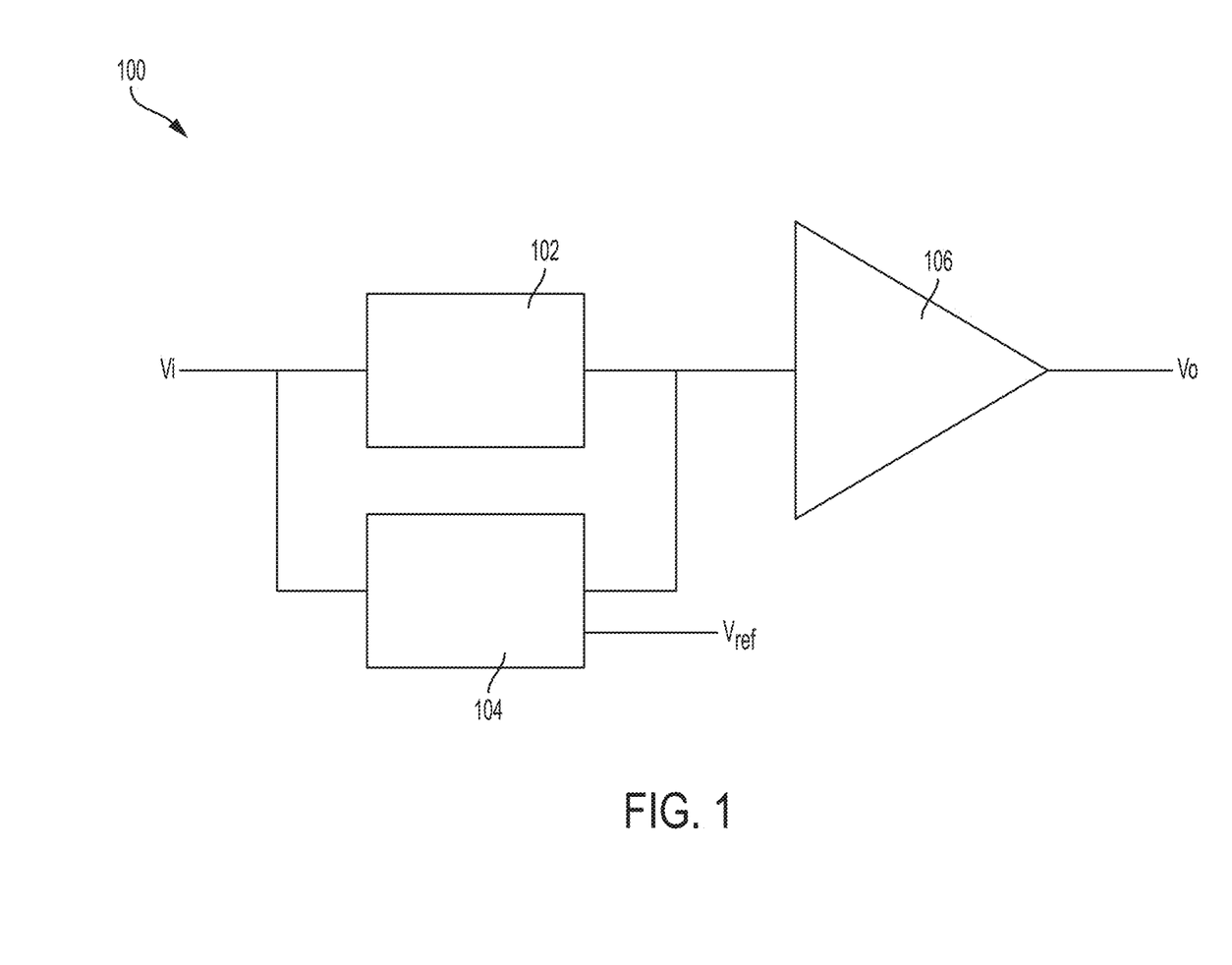
FIG. 1 is a block diagram illustrating a switched capacitor circuit and a feedback circuit, according to some non-limiting embodiments.

FIG. 1 is a block diagram illustrating a switched capacitor circuit. Switch capacitor circuit 100 may include a capacitor circuit 102, a feedback circuit 104, and an operational amplifier 106. Capacitor circuit 102 may include one or more capacitors, connected with one another in any suitable way. In some embodiments, some or all the capacitors may be coupled to a respective switch. In some embodiments, the switched capacitor circuit may serve as a sample and hold (S/H) circuit, and may for example be used in an analog-to-digital converter (ADC). However, the application is not limited in this respect and the switched capacitor circuits described herein may serve in any suitable application.

The capacitor circuit 102 may be coupled to one or more inputs of operational amplifier 106. Operational amplifier 106 may comprise a differential input stage in some embodiments, and may have two inputs. Alternatively, or additionally, operational amplifier 106 may comprise a differential output stage in some embodiments, and may have two outputs. In some embodiments, at least one output of the operational amplifier 106 may be connected to at least one input of the operational amplifier 106 (not shown in FIG. 1). In this configuration, operational amplifier 106 may operate in a closed loop. The loop may be configured to increase the bandwidth of the operational amplifier in some embodiments.

Feedback circuit 104 may have a terminal connected to an input of the capacitor circuit 102, and a terminal connected to an output of the capacitor circuit 102 and an input of operational amplifier 106. Additionally, feedback circuit 104 may be configured to receive a direct-current (DC) reference voltage $V_{ref}$. According to one aspect of the present application, feedback circuit 104 may be configured to receive a reference voltage $V_{ref}$, and to produce a stabilized version of $V_{ref}$. The expressions "stabilized version", "stabilized signal", or simply "stabilized" will be used herein to indicate compensation of a signal against process and/or temperature variations. Accordingly, a stabilized signal may exhibit fluctuations, caused by process and/or temperature variations, that are significantly less than un-stabilized signals. Reference voltages are used to bias a circuit, such as an amplifier, so as to place the circuit in a desired operating region. For example, a reference voltage may be used to bias an amplifier using metal-oxide-semiconductor (MOS) transistors so as to place the transistors in the saturation region. Reference voltages that exhibit fluctuations caused by temperature and/or process variations may cause the amplifier to provide a fluctuating gain, or in some circumstances, to depart from the saturation region. The feedback circuit 104 may include circuitry configured to generate a reference signal that is insensitive to temperature and/or process variations.

In some embodiments, capacitor circuit 102 may be configured to receive an alternating current (AC) input signal $V_i$. As a non-limiting example, $V_i$ may represent an analog signal to be digitized. In some embodiments, operational amplifier 106 may output an AC output voltage $V_o$, which may represent an analog and/or a digital signal.

In some embodiments, operational amplifier 106 may be differential, and feedback circuit 104 may include a first and second feedback circuit, each coupled to a respective input of the differential operational amplifier. Being differential, the sensitivity of the switched capacitor circuit to temperature and/or process variations may be significantly decreased with respect to single-ended configurations.

Figure 2:
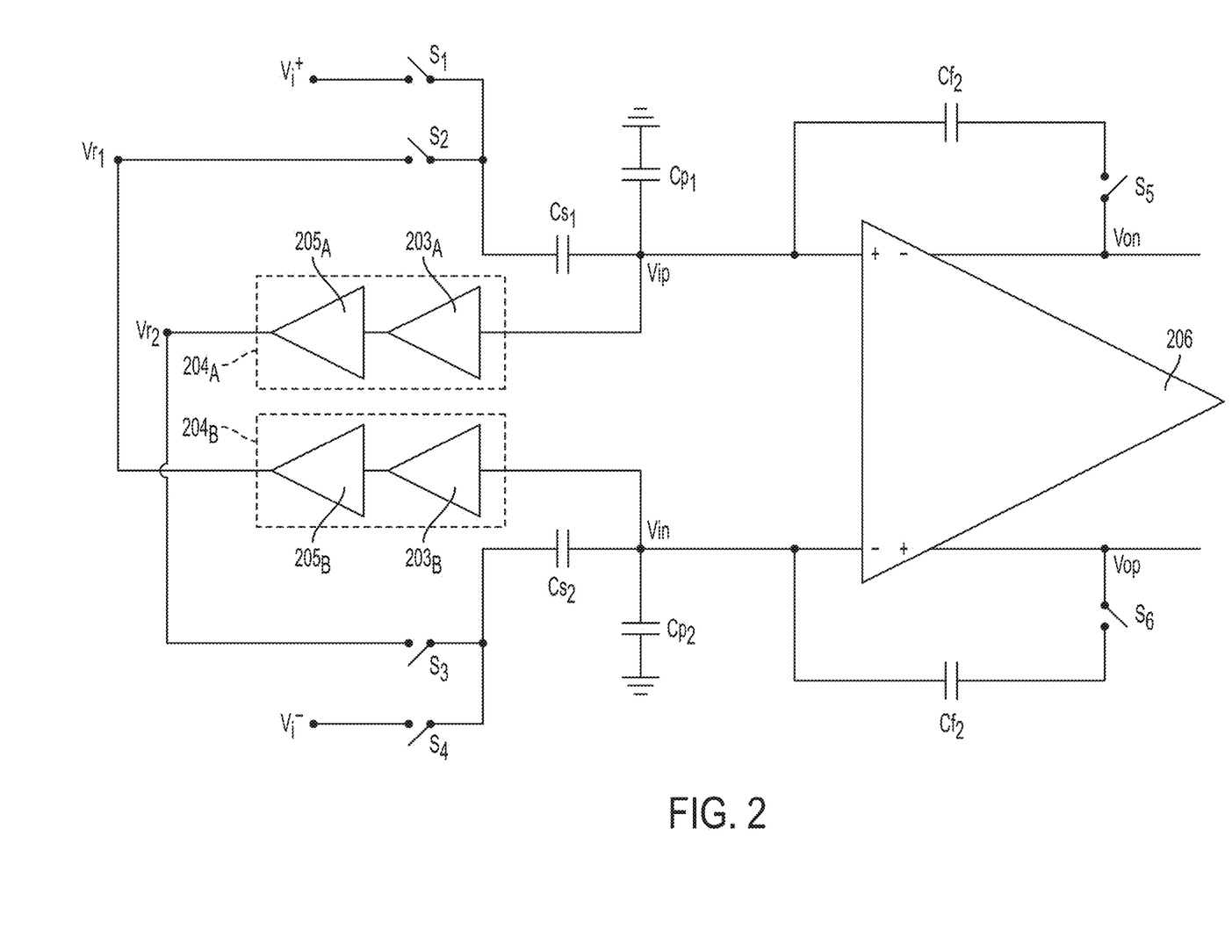
FIG. 2 is a circuit diagram illustrating a differential operational amplifier, a plurality of capacitors and a plurality of feedback circuits, according to some non-limiting embodiments.

FIG. 2 is a circuit diagram illustrating an example of system 100, according to some embodiments. FIG. 2 shows switched capacitor circuit 100 may include a plurality of capacitors, a differential operational amplifier, and a pair of feedback circuits, according to some non-limiting embodiments. Differential operational amplifier 206 may comprise a first input "+" and a second input "−". In addition, differential operational amplifier 206 may comprise a first output "−" and a second output "+". The "+" input may exhibit a voltage $V_{ip}$ having a π phase shift with respect to the voltage $V_{in}$ of the "−" input. The "+" output may exhibit a voltage $V_{op}$ having a π phase shift with respect to the voltage $V_{on}$ of the "−" output. In some embodiments, the "−" output may be connected to the "+" input through a capacitor $C_{f1}$. In some embodiments, the "−" output may be connected to the "+" input through a capacitor $C_{f1}$ and a switch $S_5$. However, the application is not limited in this respect and the "−" output may be connected to the "+" input through any suitable combination of resistive, capacitive and inductive components. In some embodiments, the "+" output may be connected to the "−" input through a capacitor $C_{f2}$. In some embodiments, the "−" output may be connected to the "+" input through a capacitor $C_{f2}$ and switch $S_6$. However, the application is not limited in this respect and the "+" output may be connected to the "−" input through any suitable combination of resistive, capacitive and inductive components.

In some embodiments, the output terminal of a capacitor $C_{s1}$ may be coupled to the "+" input of the differential operational amplifier 206, and the output terminal of a capacitor $C_{s2}$ may be coupled to the "−" input of the differential operational amplifier 206. The input terminals of capacitors $C_{s1}$ and $C_{s2}$ may be connected to the outputs of feedback circuits $204_B$ and $204_A$ respectively. An input of feedback circuit $204_A$ may be coupled to the output terminal of capacitor $C_{s1}$, and may be configured to receive voltage $V_{ip}$. Similarly, an input of feedback circuit $204_B$ may be coupled to the output terminal of capacitor $C_{s2}$, and may be configured to receive voltage $V_{in}$.

In some embodiments, capacitors $C_{p1}$ and $C_{p2}$ may be coupled to the output terminals of capacitor $C_{s1}$ and $C_{s2}$ respectively. Capacitors $C_{p1}$ and $C_{p2}$ may be further coupled to the ground terminal. In some embodiments, capacitors $C_{p1}$ and $C_{p2}$ may represent physical capacitors. In other embodiments, capacitors $C_{p1}$ and $C_{p2}$ may represent parasitic capacitances.

In some embodiments, capacitors $C_{s1}$ and $C_{s2}$ may be connected to input voltages $V_i^+$ and $V_i^-$ via switches $S_1$ and $S_4$ respectively. In some embodiments, capacitors $C_{s1}$ and $C_{s2}$ may be connected to the outputs of feedback circuits $204_A$ and $204_B$ via switches $S_2$ and $S_3$ respectively.

Figure 3:
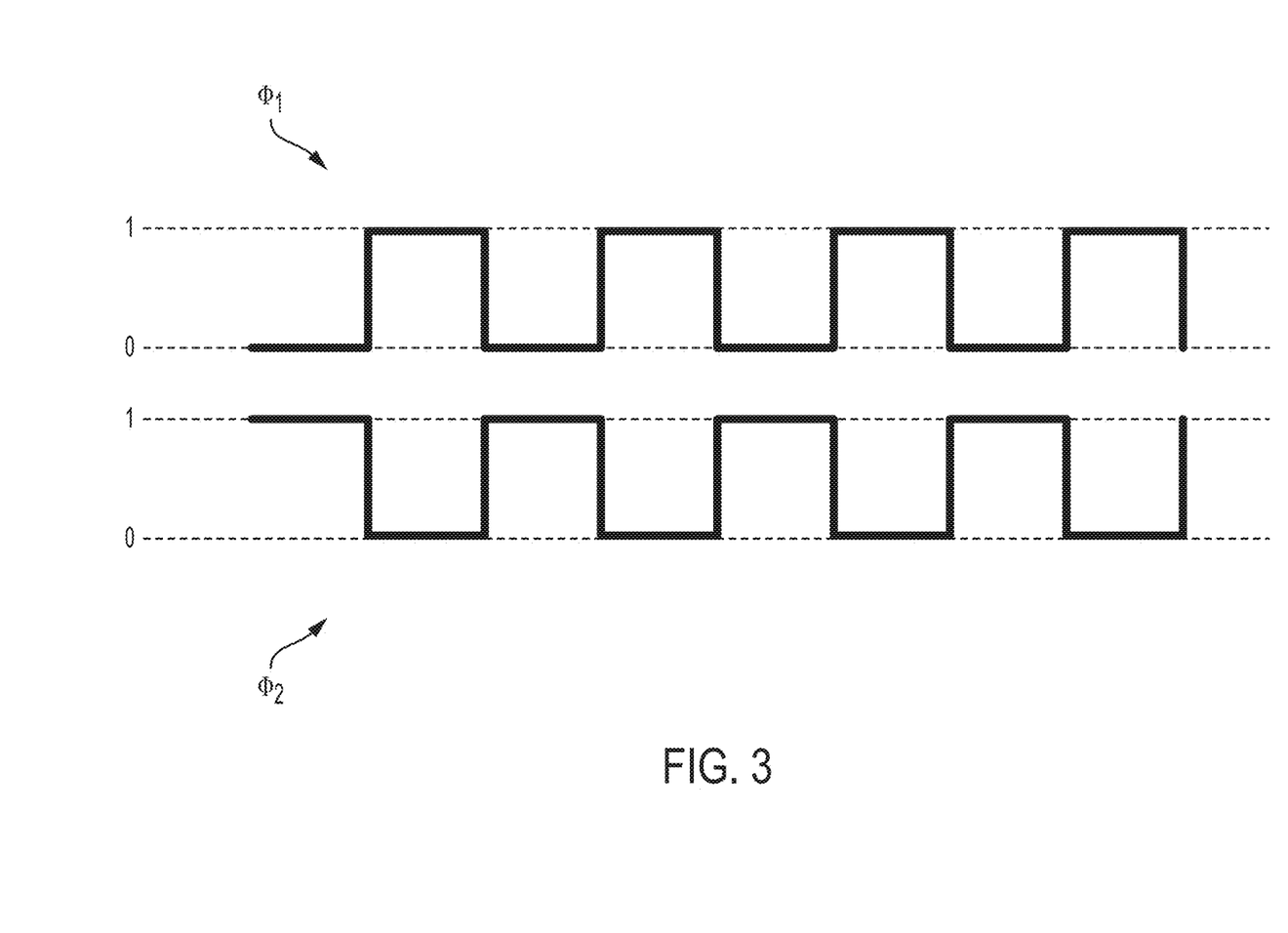
FIG. 3 is a chart illustrating a pair of control signals, according to some non-limiting embodiments.

Referring to FIG. 3, there is shown a pair of drive signals $\Phi_1$ and $\Phi_2$, according to some non-limiting embodiments. In some embodiments, when drive signals $\Phi_1$ is equal to a logic 1, drive signals $\Phi_2$ may be equal to a logic 0. In some embodiments, when drive signals $\Phi_2$ is equal to a logic 1, drive signals $\Phi_1$ may be equal to a logic 0. However, the application is not limited in this respect and drive signals $\Phi_1$ and $\Phi_2$ may assume the same logic value simultaneously in some embodiments. In some embodiments, drive signal $\Phi_1$ may be used to select the state of switches $S_1$, $S_4$. For example, when drive signal $\Phi_1$ is equal to a logic 1, the corresponding switch may be in a closed state, and when drive signal $\Phi_1$ is equal to a logic 0, the corresponding switch may be in an open state. In some embodiments, drive signal $\Phi_2$ may be used to select the state of switches $S_2$, $S_3$, $S_5$, $S_6$ or any suitable combination thereof. For example, when drive signal $\Phi_2$ is equal to a logic 1, the corresponding switch may be in a closed state, and when drive signal $\Phi_2$ is equal to a logic 0, the corresponding switch may be in an open state.

Referring back to FIG. 2, when $\Phi_1$ is equal to a logic 1, the input voltage $V_i^+$ may be coupled to capacitor $C_{s1}$ and the input voltage $V_i^-$ may be coupled to capacitor $C_{s2}$. This case will be referred to herein as the "sample" phase. When $\Phi_2$ is equal to a logic 1, feedback circuit $204_A$ may be connected to capacitor $C_{s1}$, and feedback circuit $204_B$ may be connected to capacitor $C_{s2}$. Additionally, or alternatively, the "+" input may be connected to the "−" output of the differential operational amplifier and the "−" input may be connected to the "+" output of the differential operational amplifier. This case will be referred to herein as the "hold" phase.

In some embodiments, feedback circuits $204_A$ and $204_B$ may comprise feedback amplifiers $203_A$ and $203_B$ respectively. As will be described further below, feedback amplifiers $203_A$ and $203_B$ may each comprise common-source amplifiers. The common-source amplifiers may be connected to respective resistive loads or active loads.

In some embodiments, feedback circuits $204_A$ and $204_B$ may comprise flipped voltage followers $205_A$ and $205_B$ respectively. The flipped voltage followers may be coupled to a respective feedback amplifier. In some embodiments, the feedback amplifiers may be inverting. In such embodiments, it will be assumed that the gain of the feedback amplifier $203_A$ is "$-A_{203A}$" and the gain of the feedback amplifier $203_B$ is "$-A_{203B}$". In some embodiments, the flipped voltage followers may be non-inverting. In such embodiments, it will be assumed that the gain of the flipped voltage follower $205_A$ is "$A_{205A}$" and the gain of the flipped voltage follower $205_B$ is "$A_{205B}$". However the application is not limited in this respect and the feedback amplifiers and the flipped voltage followers may be inverting or non-inverting.

In some embodiments, feedback amplifiers $203_A$ and $203_B$ may be configured to receive a reference voltage $V_{ref}$. Based, at least in part, on $V_{ref}$, the feedback circuits $204_B$ and $204_A$ may be configured to provide voltages $V_{r1}$ and $V_{r2}$ respectively. Voltages $V_{r1}$ and $V_{r2}$ will be referred to herein as "stabilized reference voltages". In some embodiments, the voltage $V_{r1}$ may be expressed by:

$$V_{r1}=V_{in}(-A_{203B})A_{205B}=V_{ip}A_{203B}A_{205B}$$

In some embodiments, feedback amplifier $203_B$ may be configured to exhibit a gain equal to:

$$(-A_{203B})=-(C_{s1}+C_{p1})/C_{s1}$$

Furthermore, the voltage $V_{ip}$ may be expressed in terms of $V_{on}$ as follows:

$$V_{ip}=V_{on}(C_{f1}/(C_{f1}+C_{p1}+C_{s1}))+V_{r1}(C_{s1}/(C_{f1}+C_{p1}+C_{s1}))$$
$$=V_{on}(C_{f1}/(C_{f1}+C_{p1}-C_{s1}))+V_{in}(-A_{203B})A_{205B}$$
$$(C_{s1}/(C_{f1}+C_{p1}-C_{s1}))=V_{on}(C_{f1}/(C_{f1}+C_{p1}+C_{s1}))+$$
$$V_{ip}A_{205B}(C_{f1}/(C_{f1}+C_{p1}-C_{s1}))$$

In some embodiments, it may be assumed that $A_{205B}$ is equal to 1. In such embodiments, following the previous expression, $V_{ip}$ may be expressed by:

$$V_{ip}(1-((C_{s1}+C_{p1})/(C_{f1}+C_{s1}+C_{p1}))=V_{on}(C_{f1}(C_{f1}+C_{p1}+C_{s1}))$$

or $$V_{ip}=V_{on}$$

As shown, in such circumstance, the operational amplifier feedback factor may be equal to 1. As defined herein, the operational amplifier feedback factor may indicate the ratio between an output voltage and a corresponding input voltage of a differential operational amplifier. In other embodiments, the operational amplifier feedback factor may be between 0.95 and 1.05, between 0.9 and 1.1, between 0.8 and 1.2, between 0.75 and 1.25, between 0.5 and 1.5, or between any other suitable values or range of values.

In some embodiments, the operational amplifier feedback factor may be independent of $C_{p1}$, $C_{f1}$, $C_{s1}$, or any suitable combination of thereof.

Similarly, it may be shown that, in some embodiments, $V_{in}=V_{op}$. In some embodiments, the operational amplifier feedback factor may be independent of $C_{p2}$, $C_{f2}$, $C_{s2}$, or any suitable combination of thereof.

One or more of the capacitances shown in FIG. 2 may be at least partially canceled, when the operational amplifier feedback factor is independent of such capacitor. In some embodiments, feedback circuits $204_A$ and $204_B$ may exhibit gains configured to mitigate a time delay associated with $C_{f1}$, $C_{f2}$, $C_{s1}$, $C_{s2}$, $C_{p1}$, $C_{p2}$, or any suitable combination thereof.

In some embodiments, each of the feedback circuits may be differential, and may be configured to receive at least two inputs. Such inputs may form a differential signal. In such embodiments, the feedback amplifiers may comprise differential amplifiers.

Figure 4:
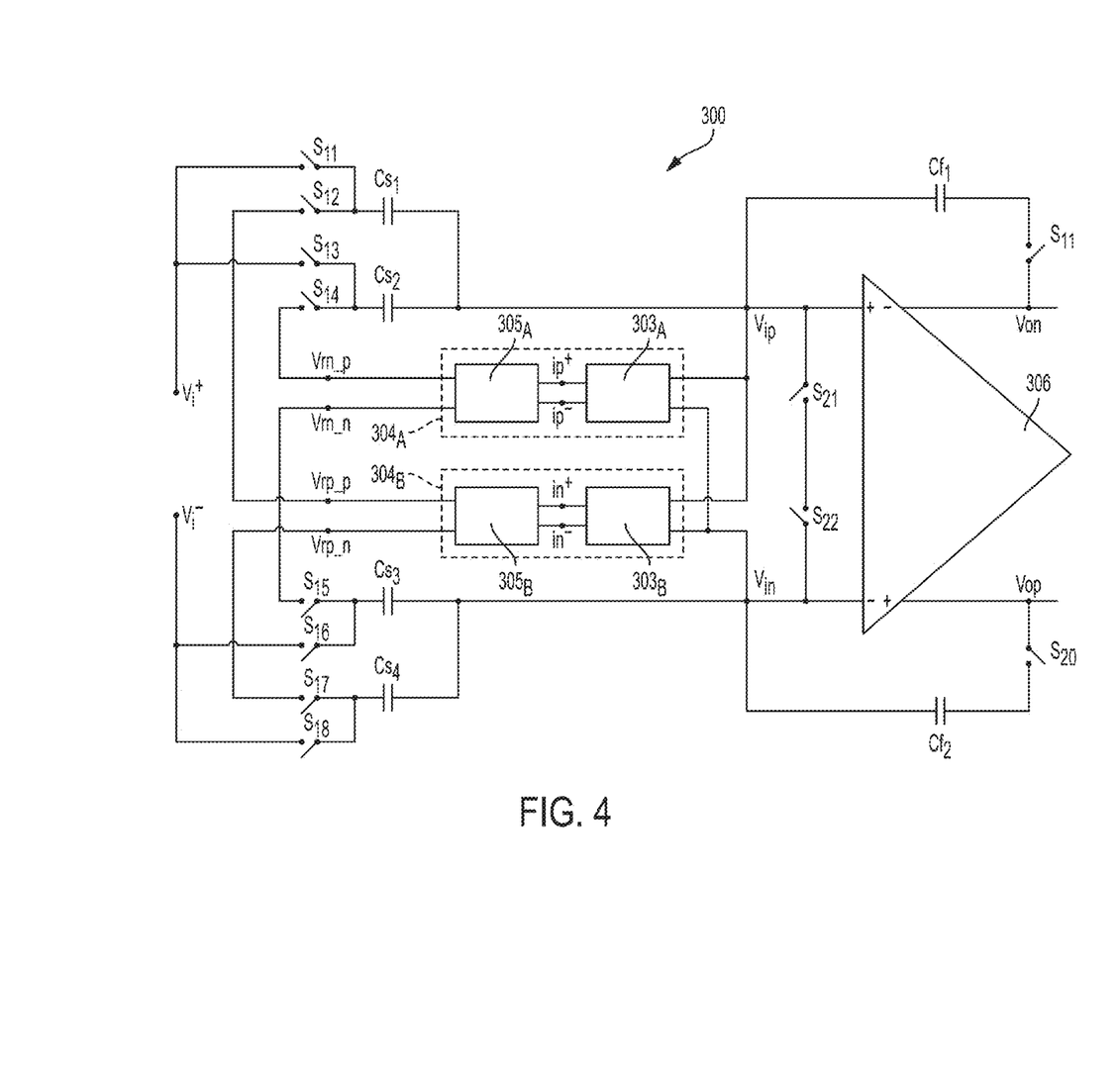
FIG. 4 is another circuit diagram illustrating a differential operational amplifier, a plurality of capacitors and a plurality of feedback circuits, according to some non-limiting embodiments.

FIG. 4 is another circuit diagram illustrating a differential operational amplifier, a plurality of capacitors and a plurality of feedback circuits, according to some non-limiting embodiments. Circuit 300 may comprise differential operational amplifier 306, feedback circuits $304_A$ and $304_B$, and capacitors $C_{s1}$, $C_{s2}$, $C_{s3}$, and $C_{s4}$. Circuit 300 may be configured to receive at least two input voltages $V_i^+$ and $V_i^-$, which in some embodiments, may form a differential signal. Input voltage $V_i^+$ is coupled to the input terminal of capacitor $C_{s1}$ via switch $S_{11}$, and to the input terminal of capacitor $C_{s2}$ via switch $S_{13}$. Input voltage $V_i^-$ be coupled to the input terminal of capacitor $C_{s3}$ via switch $S_{16}$, and to the input terminal of capacitor $C_{s4}$ via switch $S_{18}$.

Differential operational amplifier 306 may comprise a first input "+" and a second input "−". In addition, differential operational amplifier 306 may comprise a first output "−" and a second output "+". The "+" input may exhibit a voltage $V_{ip}$, having a $\pi$ phase shift with respect to the voltage $V_{in}$ of the "−" input. The "+" output may exhibit a voltage $V_{op}$ having a $\pi$ phase shift with respect to the voltage $V_{on}$ of the "−" output. In some embodiments, the "−" output may be connected to the "+" input through a capacitor $C_{f1}$. In some embodiments, the "+" output may be connected to the "−" input through a capacitor $C_{f1}$, and a switch $S_{19}$. However, the application is not limited in this respect and the "−" output may be connected to the "+" input through any suitable combination of resistive, capacitive and inductive components. In some embodiments, the "+" output may be connected to the "−" input through a capacitor $C_{f2}$. In some embodiments, the "+" output may be connected to the "−" input through a capacitor $C_{f2}$, and a switch $S_{20}$. However, the application is not limited in this respect and the "+" output may be connected to the "−" input through any suitable combination of resistive, capacitive and inductive components.

The output terminal of capacitor $C_{s1}$ and $C_{s2}$ may be connected to the "+" input of the differential operational amplifier 306. The output terminal of capacitor $C_{s3}$ and $C_{s4}$ may be connected to the "−" input of the differential operational amplifier 306. Feedback circuit $304_A$ and $304_B$ may each receive $V_{ip}$ and $V_{in+}$ as inputs.

Feedback circuit $304_A$ may be configured to output voltages $V_{Rn\_p}$ and $V_{Rn\_n}$. Voltages $V_{Rn\_p}$ and $V_{Rn\_n}$ may form a differential signal in some embodiments. Voltage $V_{Rn\_p}$ and may be coupled to capacitor $C_{s2}$ through switch $S_{14}$, and voltage $V_{Rn\_n}$ and may be coupled to capacitor $C_{s3}$ through switch $S_{15}$.

Feedback circuit $304_B$ may be configured to output voltages $V_{Rp\_p}$ and $V_{Rp\_n}$. Voltages $V_{Rp\_p}$ and $V_{Rp\_n}$ may form a differential signal in some embodiments. Voltage $V_{Rp\_p}$ and may be coupled to capacitor $C_{s1}$ through switch $S_{12}$, and voltage $V_{Rp\_n}$, and may be coupled to capacitor $C_{s4}$ through switch $S_{17}$.

In some embodiments, feedback circuits $304_A$ and $304_B$ may comprise feedback amplifiers $303_A$ and $303_B$ respectively. Feedback amplifiers $303_A$ and $303_B$ may each comprise common-source amplifiers. The common-source amplifiers may be connected to respective resistive loads or active loads. Feedback amplifier $303_A$ may be configured to output voltages $i_p^+$ and $i_p^-$, which may form a differential signal in some embodiments. Feedback amplifier $303_B$ may be configured to output voltages $i_n^+$ and $i_n^-$, which may form a differential signal in some embodiments.

In some embodiments, feedback circuits $304_A$ and $304_B$ may comprise flipped voltage followers $305_A$ and $305_B$ respectively. Flipped voltage followers $305_A$ may be configured to receive $i_p^+$ and $i_p^-$, while flipped voltage followers $305_B$ may be configured to receive $i_n^+$ and $i_n^-$. In some embodiments, the feedback amplifiers may be inverting. In such embodiments, it will be assumed that the gain of the feedback amplifier $303_A$ is "$-A_{303A}$" and the gain of the feedback amplifier $303_B$ is "$-A_{303B}$". In some embodiments, the flipped voltage followers may be non-inverting. In such embodiments, it will be assumed that the gain of the flipped voltage follower $305_A$ is "$A_{305A}$" and the gain of the flipped voltage follower $305_B$ is "$A_{305B}$". However the application is not limited in this respect and the feedback amplifiers and the flipped voltage followers may be inverting or non-inverting.

In some embodiments, feedback amplifiers $303_A$ and $303_B$ may be configured to receive reference voltages $V_{refn}$ and $V_{refp}$. Based, at least in part, on $V_{refn}$ and $V_{refp}$, the feedback circuits may be configured to provide voltages $V_{Rn\_n}$, $V_{Rn\_p}$, $V_{Rp\_n}$, and $V_{Rp\_p}$. Voltages $V_{Rn\_n}$, $V_{Rn\_p}$, $V_{Rp\_n}$, and $V_{Rp\_p}$ will be referred to herein as "stabilized reference voltages".

In some embodiments, the "+" input and the "−" input of the differential operational amplifier 306 may be connected to one another through switches $S_{21}$ and $S_{22}$.

In some embodiments, drive signal $\Phi_1$, illustrated in FIG. 3, may be used to select the state of switches $S_{11}$, $S_{13}$, $S_{16}$, $S_{18}$, $S_{21}$, $S_{22}$, or any suitable combination thereof. For example, when drive signal $\Phi_1$ is equal to a logic 1, the corresponding switch may be in a closed state, when drive signal $\Phi_1$ is equal to a logic 0, the corresponding switch may be in an open state. In some embodiments, drive signal $\Phi_2$ may be used to select the state of switches $S_{12}$, $S_{14}$, $S_{15}$, $S_{17}$, $S_{19}$, $S_{20}$, or any suitable combination thereof. For example, when drive signal $\Phi_2$ is equal to a logic 1, the corresponding switch may be in a closed state, when drive signal $\Phi_2$ is equal to a logic 0, the corresponding switch may be in an open state.

When $\Phi_1$ is equal to a logic 1, the input voltage $V_i^+$ may be coupled to capacitors $C_{s1}$ and $C_{s2}$ and the input voltage $V_i^-$ may be coupled to capacitors $C_{s3}$ and $C_{s4}$. This case will be referred to herein as the "sample" phase. When $\Phi_2$ is equal to a logic 1, feedback circuit $304_A$ may be connected to capacitors $C_{s2}$ and $C_{s3}$, and feedback circuit $304_B$ may be connected to capacitors $C_{s2}$ and $C_{s3}$. Additionally, or alternatively, the "+" input may be connected to the "−" output of the differential operational amplifier and the "−" input may be connected to the "+" output of the differential operational amplifier. This case will be referred to herein as the "hold" phase.

In some embodiments, the feedback circuits $304_A$ and $304_B$ may exhibit gains configured to make the operational amplifier feedback factor independent from some or all the capacitors of circuit 300.

Figure 5A:
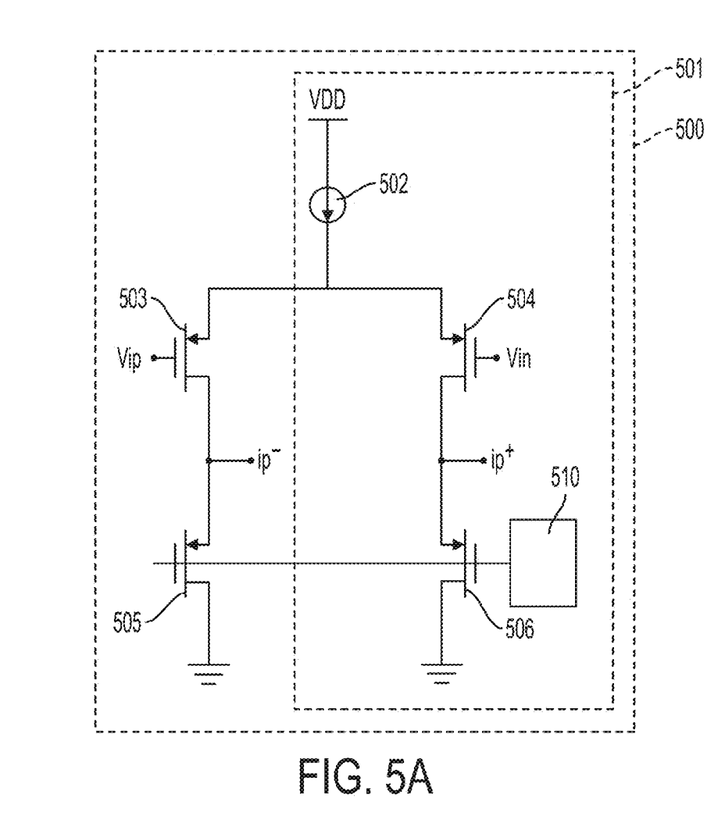
FIGS. 5A-5B are circuit diagrams illustrating feedback amplifiers, according to some non-limiting embodiments.
Figure 5B:
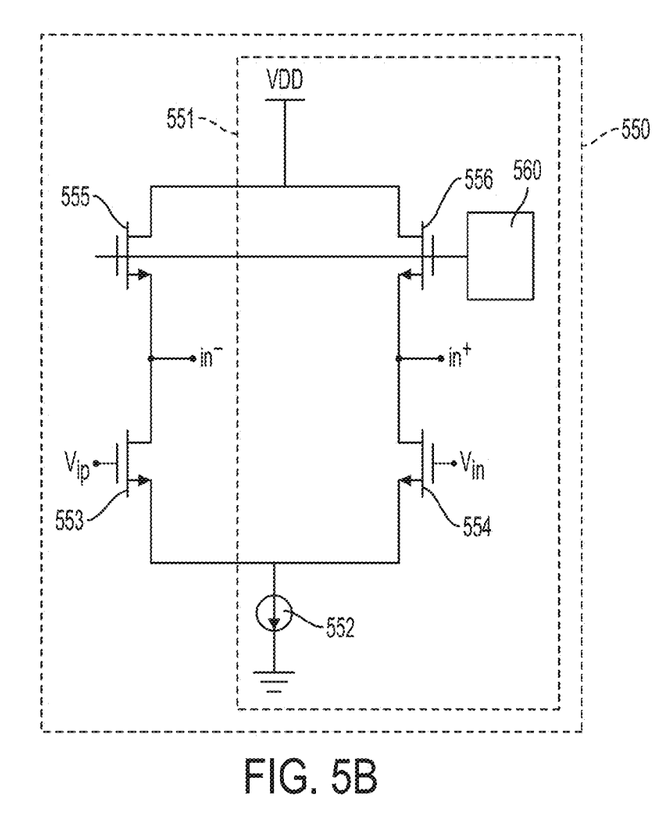

Exemplary feedback amplifiers are illustrated in FIGS. 5A-5B. FIG. 5A illustrates feedback amplifier 501, which may serve as feedback amplifier $203_A$ and/or feedback amplifier $203_B$ of FIG. 2. In addition, FIG. 5A illustrates a feedback amplifier 500, which may comprise feedback amplifier 501, and may serve as feedback amplifier $303_A$ of FIG. 4.

Feedback amplifier 501 may comprise a voltage supplier $V_{DD}$, a current generator 502, a positive metal-oxide-semiconductor (PMOS) transistor 504, and a PMOS transistor 506. PMOS transistor 504 may be serve as an amplifier, and may be used in a common-source configuration, in which the source and gate terminals form an input port and the source and drain terminals form an output port. The output of the amplifier is denoted as the output voltage ip$^+$. In some embodiments, transistor 504 is connected to a transistor 506, serving as an active load. However, the application is not limited in this respect and transistor 504 may be alternatively connected to a passive load, such as a resistor or a plurality of resistors. The gate of transistor 506 may receive a reference voltage from voltage reference generator 510. In some circumstances, the voltage reference generator 510 may be susceptible to thermal and/or process variations. However, because output DC voltages in common-source transistors are decoupled from any input DC voltage, output voltage ip$^+$ may not be susceptible to such thermal and/or process variations. PMOS transistor 504 may be configured to amplify the input voltage $V_{in}$ in some embodiments. In some embodiments, the gain provided by the feedback amplifier 501 may be equal to $-g_M$ times the input impedance of the load, where $g_M$ is defined as the trans-conductance of transistor 504. In some embodiments, the gain may be configured to mitigate the time delay associated with one or more capacitors of FIG. 2.

Feedback amplifier 500 may comprise feedback amplifier 501 and PMOS transistors 503 and 505. PMOS transistor 503 may be used in common-source configuration. PMOS transistors 503 and 504 may operate as a differential amplifier, and may configured to amplify the differential signal $V_{ip}$-$V_{in}$ (or $V_{in}$-$V_{ip}$). Feedback amplifier 500 may generate output voltages ip$^+$ and ip$^-$, which may phased shifted by $\pi$ with respect to one another. In some embodiments, transistor 503 is connected to a transistor 505, serving as an active load. However, the application is not limited in this respect and transistor 503 may be alternatively connected to a passive load, such as a resistor or a plurality of resistors. The gate of transistor 505 may receive a reference voltage from voltage reference generator 510. Because output DC voltages in common-source transistors are decoupled from input DC voltages, output voltages ip$^+$ and ip$^-$ may be insensitive to thermal and/or process variations.

While feedback amplifiers 500 and 501 utilize PMOS transistors in some embodiments, the application is not limited in this respect and any other suitable type of transistor may be used, such as an NPN bipolar junction transistor (BJT), a PNP BJT, a junction field effect transistor (JFET), a metal-oxide-semiconductor field effect transistor (MESFET), etc.

FIG. 5B illustrates feedback amplifier 551, which may serve as feedback amplifier $203_A$ and/or feedback amplifier $203_B$ of FIG. 2. In addition, FIG. 5B illustrates a feedback amplifier 550, which may comprise feedback amplifier 551, and may serve as feedback amplifier $303_B$ of FIG. 4.

Feedback amplifier 551 may comprise a voltage supplier $V_{DD}$, a current generator 552, a negative metal-oxide-semiconductor (NMOS) transistor 554, and an NMOS transistor 556. NMOS transistor 554 may be serve as an amplifier, and may be used in a common-source configuration, in which the source and gate terminals form an input port and the source and drain terminals form an output port. The output of the amplifier is denoted as the output voltage in$^+$. In some embodiments, transistor 554 is connected to a transistor 556, serving as an active load. However, the application is not limited in this respect and transistor 554 may be alternatively connected to a passive load, such as a resistor or a plurality of resistors. The gate of transistor 556 may receive a reference voltage from voltage reference generator 560. In some circumstances, the voltage reference generator 560 may be susceptible to thermal and/or process variations. However, because output DC voltages in common-source transistors are decoupled from input DC voltages, output voltage in$^+$ may not be susceptible to such thermal and/or process variations. NMOS transistor 554 may be configured to amplify the input voltage $V_{in}$ in some embodiments. In some embodiments, the gain provided by the feedback amplifier 551 may be equal to $-g_M$ times the input impedance of the load, where $g_M$ is defined as the trans-conductance of transistor 554. In some embodiments, the gain may be configured to mitigate the time delay associated with one or more capacitors of FIG. 2.

Feedback amplifier 550 may comprise feedback amplifier 551 and NMOS transistors 553 and 555. NMOS transistor 553 may be used in common-source configuration. NMOS transistors 553 and 554 may operate as a differential amplifier, and may configured to amplify the differential signal $V_{ip}-V_{in}$ (or $V_{in}-V_{ip}$). Feedback amplifier 550 may generate output voltages in$^+$ and in$^-$, which may phased shifted by $\pi$ with respect to one another. In some embodiments, transistor 553 is connected to a transistor 555, serving as an active load. However, the application is not limited in this respect and transistor 553 may be alternatively connected to a passive load, such as a resistor or a plurality of resistors. The gate of transistor 555 may receive a reference voltage from voltage reference generator 560. Because output DC voltages in common-source transistors are decoupled from input DC voltages, output voltages in$^+$ and in$^-$ may not be susceptible to thermal and/or process variations.

While feedback amplifiers 550 and 551 utilize NMOS transistors in some embodiments, the application is not limited in this respect and any other suitable type of transistor may be used, such as an NPN bipolar junction transistor (BJT), a PNP BJT, a junction field effect transistor (JFET), a metal-oxide-semiconductor field effect transistor (MESFET), etc.

Figure 6A:
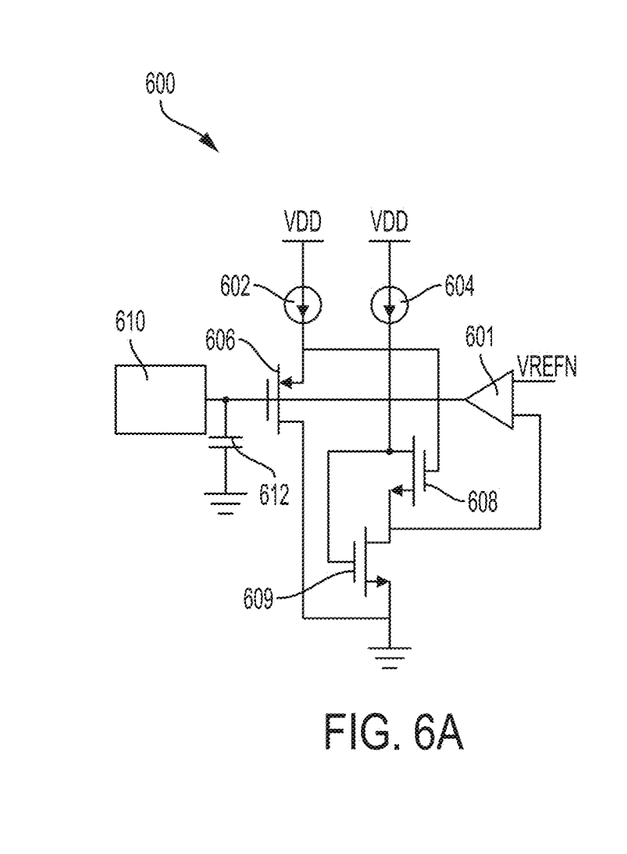
FIGS. 6A-6B are circuit diagrams illustrating voltage reference generators, according to some non-limiting embodiments.
Figure 6B:
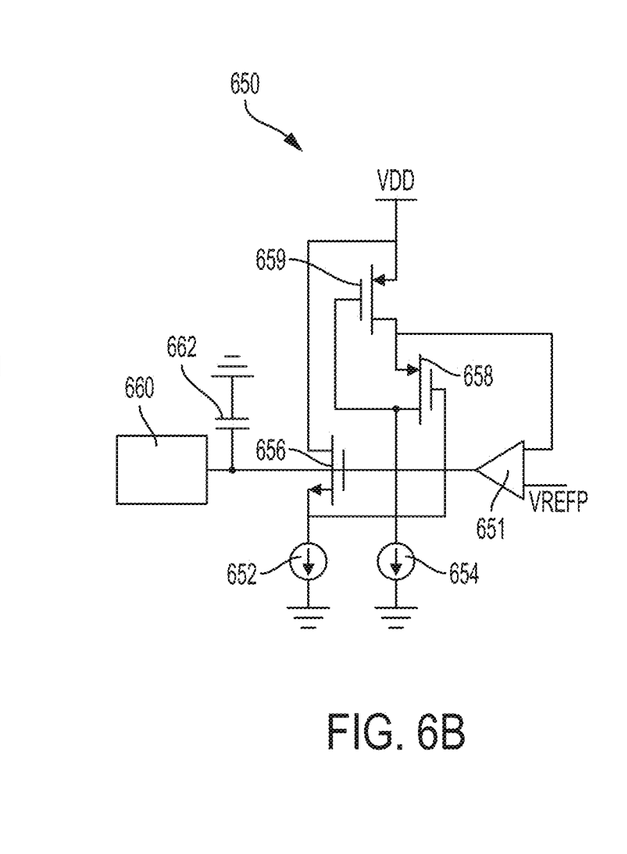

Exemplary voltage reference generators are illustrated in FIGS. 6A-6B, according to some non-limiting embodiments. Voltage reference generator 600 may serve as voltage reference generator 510 of FIG. 5A, and voltage reference generator 650 may serve as voltage reference generator 560 of FIG. 5B.

As illustrated in FIG. 6A, voltage reference generator 600, also referred to herein as "replica bias" may be connected to feedback amplifier 610, which may serve as feedback amplifier 500 and/or 501 of FIG. 5A. Voltage reference generator 600 may comprise voltage supplier $V_{DD}$, current generators 602 and 604, operational amplifier 601, NMOS transistors 608 and 609, and PMOS transistor 606. A first input terminal of operational amplifier 601 may receive a reference voltage $V_{refn}$. In some embodiments, current generator 602 may be connected to the source of PMOS transistor 606, whose drain may be connected to ground. Current generator 604 may be connected to the drain of NMOS transistor 608 and to the gate of NMOS transistor 609. The drain of NMOS transistor 609 may be connected to the source of NMOS transistor 608 and to a second input terminal of operational amplifier 601. In some embodiments, voltage reference generator 600 and feedback amplifier 610 may be coupled through capacitor 612. Being NMOS transistor 609 used in a common-source configuration, the reference voltage provided to feedback amplifier 610 may not be susceptible to thermal and/or process variations.

As illustrated in FIG. 6B, voltage reference generator 660, also referred to herein as "replica bias" may be connected to feedback amplifier 660, which may serve as feedback amplifier 550 and/or 551 of FIG. 5B. Voltage reference generator 650 may comprise voltage supplier $V_{DD}$, current generators 652 and 654, operational amplifier 651, PMOS transistors 658 and 659, and NMOS transistor 656. A first input terminal of operational amplifier 651 may receive a reference voltage $V_{refp}$. In some embodiments, current generator 652 may be connected to the source of NMOS transistor 656, whose drain may be connected to $V_{DD}$. Current generator 654 may be connected to the drain of PMOS transistor 608 and to the gate of PMOS transistor 659. The drain of PMOS transistor 659 may be connected to the source of PMOS transistor 658 and to a second input terminal of operational amplifier 651. In some embodiments, voltage reference generator 650 and feedback amplifier 660 may be coupled through capacitor 662. Being PMOS transistor 659 used in a common-source configuration, the reference voltage provided to feedback amplifier 660 may not be susceptible to thermal and/or process variations.

Figure 7A:
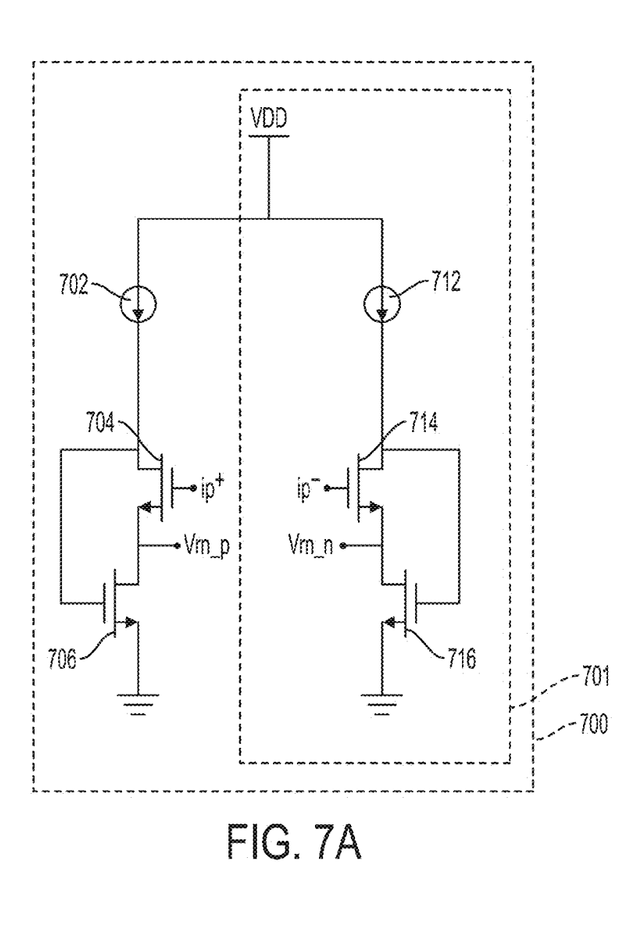
FIGS. 7A-7B are circuit diagrams illustrating flipped voltage followers, according to some non-limiting embodiments.
Figure 7B:
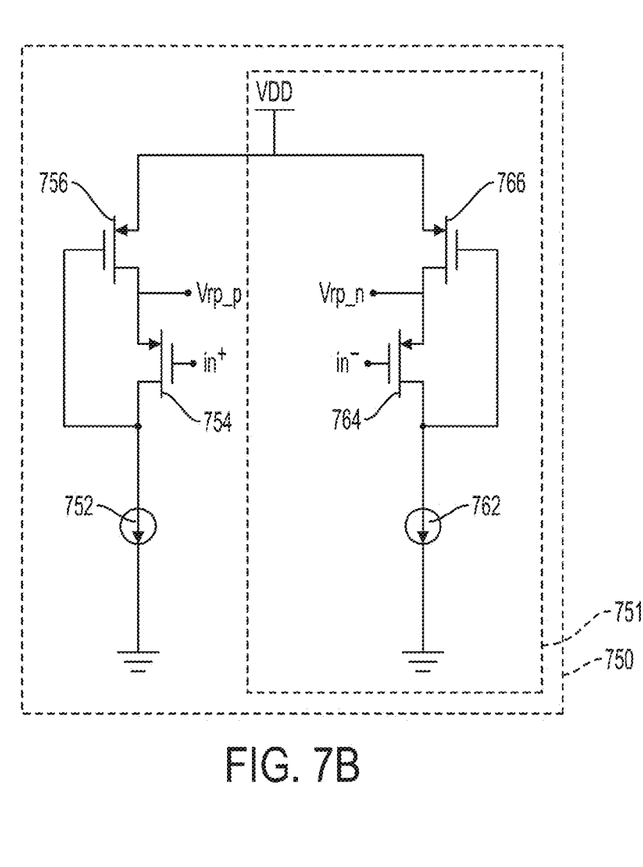

In some embodiments, the output of the feedback amplifiers may be coupled to inputs of flipped voltage followers. Exemplary flipped voltage followers are illustrated in FIGS. 7A-7B, according to some non-limiting embodiments. In some embodiments, a flipped voltage follower may be used as a buffer between the feedback amplifier and a switched capacitor to increase the bandwidth of the switched-capacitor circuit. In some embodiments, the flipped voltage follower exhibits a slew rate that is larger than the slew rate of the feedback amplifier. Accordingly, the use of a flipped voltage follower of the type described herein may improve the slew rate of the feedback circuit.

Flipped voltage follower 701, illustrated in FIG. 7A, may serve as flipped voltage follower $205_A$ and/or $205_B$ of FIG. 2, while flipped voltage follower 700 may serve as flipped voltage follower $305_A$ of FIG. 4. Flipped voltage follower 701 may comprise voltage supplier $V_{DD}$, current generator 712 and NMOS transistors 714 and 716. The current generator 712 may be connected to the drain of NMOS transistor 714 and the gate of NMOS transistor 716. The source of NMOS transistor 714 may be connected to the drain of NMOS transistor 716, and the source of NMOS transistor 716 may be connected to ground. In some embodiments, the flipped voltage follower 701 may be configured to receive input signal ip$^-$, to provide gain, and to output signal $V_{Rn\_n}$. In some embodiments, the flipped voltage follower may be configured to provide a unitary gain. Alternatively, the flipped voltage follower may be configured to provide a gain that is between 0.95 and 1.05, between 0.9 and 1.1, between 0.8 and 1.2, between 0.75 and 1.25, between 0.5 and 1.5, or between any other suitable values or range of values.

Flipped voltage follower 700 may comprise flipped voltage follower 701, NMOS transistors 704 and 706, and current generator 702. The current generator 702 may be connected to the drain of NMOS transistor 704 and the gate of NMOS transistor 706. The source of NMOS transistor 704 may be connected to the drain of NMOS transistor 706, and the source of NMOS transistor 706 may be connected to ground. In some embodiments, the flipped voltage follower 700 may be configured to receive input signal $ip^+$-$ip^-$ (or $ip^-$-$ip^+$), to provide gain, and to output signals $V_{Rn\_p}$ and $V_{Rn\_n}$. Signals $V_{Rn\_p}$ and $V_{Rn\_n}$ may be phase shifted by $\pi$ with respect to one another. In some embodiments, the flipped voltage follower 700 may be configured to provide a unitary gain. Alternatively, the flipped voltage follower may be configured to provide a gain that is between 0.95 and 1.05, between 0.9 and 1.1, between 0.8 and 1.2, between 0.75 and 1.25, between 0.5 and 1.5, or between any other suitable values or range of values.

Flipped voltage follower 751, illustrated in FIG. 7B, may serve as flipped voltage follower $205_A$ and/or $205_B$ of FIG. 2, while flipped voltage follower 750 may serve as flipped voltage follower $305_B$ of FIG. 4. Flipped voltage follower 751 may comprise voltage supplier $V_{DD}$, current generator 762 and PMOS transistors 764 and 766. The current generator 762 may be connected to the drain of PMOS transistor 764 and the gate of PMOS transistor 766. The source of PMOS transistor 764 may be connected to the drain of PMOS transistor 766, and the source of PMOS transistor 766 may be connected to ground. In some embodiments, the flipped voltage follower 751 may be configured to receive input signal $in^-$, to provide gain, and to output signal $V_{Rp\_n}$. In some embodiments, the flipped voltage follower may be configured to provide a unitary gain. Alternatively, the flipped voltage follower may be configured to provide a gain that is between 0.95 and 1.05, between 0.9 and 1.1, between 0.8 and 1.2, between 0.75 and 1.25, between 0.5 and 1.5, or between any other suitable values or range of values.

Flipped voltage follower 750 may comprise flipped voltage follower 751, PMOS transistors 754 and 756, and current generator 752. The current generator 752 may be connected to the drain of PMOS transistor 754 and the gate of PMOS transistor 756. The source of PMOS transistor 754 may be connected to the drain of PMOS transistor 756, and the source of PMOS transistor 756 may be connected to ground. In some embodiments, the flipped voltage follower 750 may be configured to receive input signal $in^+$-$in^-$ (or $in^-$-$in^+$), to provide gain, and to output signals $V_{Rp\_p}$ and $V_{Rp\_n}$. Signals $V_{Rp\_p}$ and $V_{Rp\_n}$ may be phase shifted by $\pi$ with respect to one another. In some embodiments, the flipped voltage follower 750 may be configured to provide a unitary gain. Alternatively, the flipped voltage follower may be configured to provide a gain that is between 0.95 and 1.05, between 0.9 and 1.1, between 0.8 and 1.2, between 0.75 and 1.25, between 0.5 and 1.5, or between any other suitable values or range of values.

Switched capacitor circuits of the type described herein may be used in multiplying digital-to-analog converters (MDAC). Multiplying digital-to-analog converters differ from conventional analog-to-digital converters in that they employ varying reference voltages. To ensure accurate digital-to-analog conversion, it is desirable that the varying reference voltage is insensitive to temperature and/or process variations. In some embodiments, the switched capacitor circuit of FIG. 2 may be used in a MDAC. In such embodiments, the voltages $V_{r1}$ and $V_{r2}$ may be used as stabilized varying reference voltages for the MDAC. In some embodiments, the switched capacitor circuit of FIG. 4 may be used in a MDAC. In such embodiments, the voltages $V_{Rn\_p}$, $V_{Rn\_n}$, $V_{Rp\_p}$ and $V_{Rp\_n}$ may be used as stabilized varying reference voltages for the MDAC. Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including", "comprising", "having", "containing" or "involving" and variations thereof herein, is meant to encompass the items listed thereafter and equivalents thereof as well as additional items.

The use of "coupled" or "connected" is meant to refer to circuit elements, or signals, that are either directly linked to one another or through intermediate components.

What is claimed is:

1. A switched-capacitor circuit, comprising:
    a differential operational amplifier;
    at least one capacitor coupled to an input of the differential operational amplifier; and
    a feedback circuit coupled to the input of the differential operational amplifier and an input of the switched-capacitor circuit, the feedback circuit being configured to receive a reference signal and to produce, based at least in part on the reference signal, at least one stabilized reference signal,
    wherein the feedback circuit comprises a flipped voltage follower and wherein the flipped voltage follower comprises an input connected to an output of a common source amplifier.

2. The switched capacitor circuit of claim 1, wherein the feedback circuit comprises a common source amplifier.

3. The switched-capacitor circuit of claim 2, wherein the common source amplifier exhibits a gain configured to cancel, at least in part, a capacitance of the at least one capacitor.

4. The switched capacitor circuit of claim 2, wherein the common source amplifier is connected to an active load.

5. The switched capacitor circuit of claim 2, wherein the common source amplifier comprises a differential amplifier.

6. The switched capacitor circuit of claim 1, wherein the feedback circuit comprises a replica bias circuit.

7. A switched-capacitor circuit, comprising:
    a differential operational amplifier; and
    at least one capacitor coupled to an input of the differential operational amplifier; and a feedback circuit coupled to the input of the differential operational amplifier and an input of the switched-capacitor circuit,
    wherein the feedback circuit exhibits a gain configured to cancel, at least in part, a capacitance of the at least one capacitor, and
    wherein the feedback circuit comprises a flipped voltage follower circuit and wherein the flipped voltage follower comprises an input connected to an output of a common source amplifier.

8. The switched-capacitor circuit of claim 7, wherein the differential operational amplifier exhibits a feedback factor that is independent of the at least one capacitor.

9. The switched capacitor circuit of claim 7, wherein the feedback circuit comprises the common source amplifier.

10. The switched capacitor circuit of claim 9, wherein the common source amplifier is connected to an active load.

11. The switched capacitor circuit of claim 9, wherein the common source amplifier comprises a differential amplifier.

12. The switched capacitor circuit of claim 7, wherein the feedback circuit comprises a replica bias circuit.

13. A switched-capacitor circuit, comprising:
a differential operational amplifier;
a first and a second capacitor, the first capacitor being coupled to an input of the differential operational amplifier;
a first feedback circuit coupled to an output of the second capacitor, the input of the differential operational amplifier, and an input of the switched-capacitor circuit, the first feedback circuit being configured to receive a reference signal and to produce, based at least in part on the reference signal, at least one stabilized reference signal; and
a second feedback circuit coupled to an output of the first capacitor and an input of the second capacitor.

14. The switched-capacitor circuit of claim 13, wherein the first feedback circuit comprises a common source amplifier.

15. The switched-capacitor circuit of claim 13, wherein the first feedback circuit comprises a flipped voltage follower.

16. A switched-capacitor circuit, comprising:
a differential operational amplifier;
a first and a second capacitor, the first capacitor being coupled to an input of the differential operational amplifier;
a first feedback circuit coupled to an output of the second capacitor, the input of the differential operational amplifier and an input of the switched-capacitor circuit; and
a second feedback circuit coupled to an output of the first capacitor and an input of the second capacitor,
wherein the first feedback circuit exhibits a gain configured to cancel, at least in part, a capacitance of the first capacitor.

17. The switched-capacitor circuit of claim 16, wherein the first feedback circuit comprises a common source amplifier.

18. The switched-capacitor circuit of claim 16, wherein the first feedback circuit comprises a flipped voltage follower.

19. The switched capacitor of claim 13, wherein the first feedback circuit is configured to output a first signal and the second feedback circuit is configured to output a second feedback signal, wherein the first signal and the second signal have opposite phases.

20. The switched capacitor of claim 16, wherein the first feedback circuit is configured to output a first signal and the second feedback circuit is configured to output a second feedback signal, wherein the first signal and the second signal have opposite phases.

* * * * *